US008661381B1

(12) United States Patent
Malhotra et al.

(10) Patent No.: US 8,661,381 B1
(45) Date of Patent: Feb. 25, 2014

(54) METHOD AND APPARATUS FOR PERFORMING OPTIMIZATION USING DON'T CARE STATES

(75) Inventors: Shawn Malhotra, Toronto (CA); Valavan Manohararajah, Scarborough (CA)

(73) Assignee: Altera Corporation, San Jose, CA (US)

( * ) Notice: Subject to any disclaimer, the term of this patent is extended or adjusted under 35 U.S.C. 154(b) by 1057 days.

(21) Appl. No.: 12/152,499

(22) Filed: May 15, 2008

(51) Int. Cl.
*G06F 17/50* (2006.01)
(52) U.S. Cl.
USPC .......................................................... 716/104
(58) Field of Classification Search
USPC .................................................. 716/100–139
See application file for complete search history.

(56) References Cited

U.S. PATENT DOCUMENTS

| | | | |
|---|---|---|---|
| 5,461,574 A * | 10/1995 | Matsunaga et al. | 716/123 |
| 7,219,048 B1 * | 5/2007 | Xu | 703/19 |
| 7,376,919 B1 * | 5/2008 | McElvain et al. | 716/103 |
| 2002/0178432 A1 * | 11/2002 | Kim et al. | 716/18 |
| 2004/0068331 A1 * | 4/2004 | Cronquist | 700/18 |
| 2007/0266348 A1 * | 11/2007 | Yoshikawa | 716/3 |

\* cited by examiner

*Primary Examiner* — Vuthe Siek
*Assistant Examiner* — Aric Lin
(74) *Attorney, Agent, or Firm* — L. Cho

(57) ABSTRACT

A method for designing a system on a target device includes determining a realization set of a signal that includes one or more representations of the signal where at least one of the representation is influenced by a Don't Care Set (DCS) and all representations are equivalent. The realization set is propagated through the system with the signal. The realization set is used to perform a plurality of separate optimizations on the logic.

36 Claims, 11 Drawing Sheets

|     | IN_1 |   |
|-----|------|---|
|     | 0    | 1 |
| IN_2 0 | 0 | 0 |
|   1 | 0    | 1 |

FIG. 5A

|     | IN_1 |   |
|-----|------|---|
|     | 0    | 1 |
| IN_2 0 | 0 | 0 |
|   1 | 0    | X | 1

FIG. 5B

|     | IN_1 |   |
|-----|------|---|
|     | 0    | 1 |
| IN_2 0 | 0 | 0 |
|   1 | 0    | (X  1) |

FIG. 5C

|     | IN_3 IN_4 | 00 | 01 | 11 | 10 |
|-----|-----------|----|----|----|----|

METHOD AND APPARATUS FOR PERFORMING OPTIMIZATION USING DON'T CARE STATES

TECHNICAL FIELD

Embodiments of the present invention relates to tools such as electronic design automation (EDA) tools for designing systems on field programmable gate arrays (FPGAs). More specifically, embodiments of the present invention relate to a method and apparatus for performing optimization using Don't Care sets (DCSs) with EDA tools.

BACKGROUND

FPGAs may be used to implement large systems that include million of gates and megabits of embedded memory. Of the tasks required in creating and optimizing a design, synthesizing the design, placement of components on the FPGAs, and routing connection between components on the FPGA utilizing available resources can be the most challenging and time consuming. In order to satisfy timing requirements and system specifications, several iterations are often required to determine how the design should be implemented, where components are to be placed on the target device, and which routing resources to allocate to connect the components. The complexity of large systems often requires the use of EDA tools to create and optimize their design onto physical target devices. Automated synthesis, placement and routing algorithms in EDA tools perform the time consuming task synthesis, placement, and routing of components onto physical devices.

A DCS represents a set of one or more values that are not taken for a signal in the system. The values may not be taken generally or in response to one or more conditions. In the past, information about a signal's DCS could be used in the design of a system on a target device. Typically the information would be used only during an early stage of synthesis where a hardware description language (HDL) of the system is converted to building blocks such as adders, registers, multipliers, and other high level building blocks at a register transfer level (RTL). Furthermore, the information regarding a signal's DCS would only be used at a single instance for optimization and then discarded. Further use of information about a signal's DCS would not be utilized after an initial optimization has taken place.

SUMMARY

According to an embodiment of the present invention, DCSs are utilized for optimizing a system design during synthesis. The DCSs may be utilized for optimization during one or more stages of synthesis after RTL conversion. Furthermore, information regarding a signal's DCS, such as its realization set, may be propagated with the signal and be available for use for optimization at additional locations on the system or at additional instances after an initial optimization with the information has taken place.

According to an embodiment of the present invention, DCSs for signals may be specified by a designer by providing signal list specifications or a network specification. Alternatively, DCSs for signals may be extracted by an EDA tool by identifying assertion statements in HDL or by analyzing simulation results.

BRIEF DESCRIPTION OF THE DRAWINGS

The features and advantages of the present invention are illustrated by way of example and are by no means intended to limit the scope of the present invention to the particular embodiments shown.

FIGS. 5a-c illustrate an example of how a realization set is computed for a signal T1 according to an embodiment of the present invention.

FIGS. 6a-b illustrate an example of how a realization set is computed for a signal T3 according to an embodiment of the present invention.

DETAILED DESCRIPTION

In the following description, for purposes of explanation, specific nomenclature is set forth to provide a thorough understanding of embodiments of the present invention. It will be apparent to one skilled in the art that specific details in the description may not be required to practice the embodiments of the present invention. In other instances, well-known circuits, devices, and programs are shown in block diagram form to avoid obscuring embodiments of the present invention unnecessarily.

Figure 1:
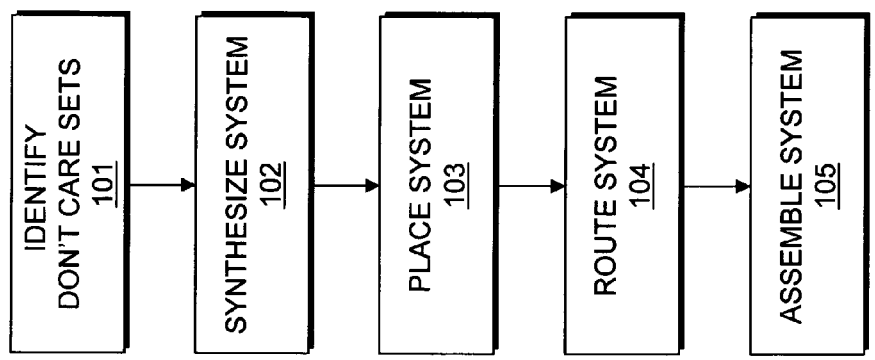
FIG. 1 is a flow chart illustrating a method for designing a system on a logic design according to an embodiment of the present invention.

FIG. 1 is a flow chart illustrating a method for designing a system according to an embodiment of the present invention. The method may be performed by a system designer such as an EDA tool. The target device may be an ASIC, structured ASIC, FPGA, programmable logic device (PLD), printed circuit board (PCB), or other target device.

At 101, DCSs for the system are identified. A DCS represents a set of one or more values that are not taken for a signal in the system. The values may not be taken generally or in response to one or more conditions. The signal may be an input signal to the system or any other signal in the system. According to an embodiment of the present invention, a DCS for the system may be identified by user entered assignment in a text-based assignment in a configuration file, graphical user interface, or a scripting interface.

One example of a text-based assignment format is shown below.

define_dcs [signal_list] [vector_list]<invert>

In this format, the signal_list corresponds to a list of signals in the design. These signals can include registers, input pins, output pins, and any other supported resource. The vector_list is a list of bit-vectors that the signal_list can not be equal to. The vector can be expressed in binary or hexadecimal format. The optional "invert" flag changes the interpretation of the vector_list to represent a list of all bit-vectors that the signal_list can be equal to. In this case, any bit-vectors not in the list are part of the DCS associated with those signals.

The order of the signal_list is important as shown in the example below.

define_dcs {A, B, C} {101, 000}

This assignment means that the signals can never take on the values {A=1, B=0, C=1} or {A=0, B=0, C=0}. If we add the "invert" flag to the end of the assignment, this would imply that these are the only possible values for the 3 signals and that other 6 combinations constitute the DCS for {A, B, C}. In addition to the "0", and "1" values, a wildcard "*" value may be used to represent either symbol.

Another example of a text-based assignment format is shown below.

define_dcs [signal_list] [relation]

In this format, instead of an explicit vector list, common relations between signals can be expressed with a simple text string. This list can include the following relations.

| = | → | implies all signals in the signal_list are logically equal |
| mutex | → | implies all signals in the signal_list are mutually exclusive (only one is active at a given time) |
| one-hot | → | implies that exactly one signal in a group is active |

Once a relation is specified, the resulting bit-vectors in the DCS can be extracted automatically. This allows a user to easily enter any arbitrary DCS for any set of signals.

In addition to entering sets in the manner described above, users can also specify a Don't Care network in a hardware description language such as VHDL or Verlog. This network would represent a system with multiple inputs and a single output. All inputs that cause the output to be true represent the DCS of the design. If the user chooses to input the set in this fashion, it can converted into a more traditional DCS specification automatically by evaluating all input combinations of the Don't Care Network to identify the DCS for the design (any input combination causing the output to be true represents a DCS across the primary inputs to the system). According to an embodiment of the present invention, a user can specify multiple independent Don't Care networks to scale down the problem.

According to an alternate embodiment of the present invention, a DCS for the system may be identified by automated DCS extraction performed by the EDA tool. According to one embodiment, the EDA tool may suggest potential DCSs for a given design that has a high probability of being true. In this embodiment, the user may choose to accept or reject the suggestions. DCS extraction may be made from assertion statements in HDL and from simulation results.

Users may include assertion statements in their HDL to indicate that a certain state is impossible to reach, and that if it is reached, the system is in an error state. This information may be used to propose potential Don't Care Sets to the user. An assumption is made that the assertion will be true and the conditional statement is used as a DCS. For instance, if a logic block has an assertion of the form 'ASSERT(r1 !=r2)', the two signals may be inferred to be mutually exclusive and the potential DCS is proposed to the user.

According to an embodiment of the present invention, the design can be compiled in a 'debug mode' where the assertion blocks are realized as simple modules that drive a debug pin if the assertion fails. If the user simulates such a design with test vectors and finds that the assertion never fails, the user can be confident that it is a valid assertion and the assertion can safely be turned into a DCS.

Another area where DCSs can be inferred is during simulation. When a large set of test vectors are run through their system, the results can be analyzed. If there are a set of timing critical nodes or high-fanout nodes that appear to have a well-defined relation between them, the EDA tool can propose them as possible DCSs to the user. It is not practical to check all potential relations between all nodes, which is why focusing on the most critical nodes is a reasonable approach. If the user's simulation coverage is good and captures most of the system's test cases, the suggestion has a good chance of being a valid DCS.

At 102, synthesis is performed on a design of a system. According to an embodiment of the present invention, synthesis generates an optimized logical representation of the system from a HDL design definition. The optimized logical representation of the system may include a representation that has a minimized number of functional blocks such as logic gates, logic elements, and registers required for the system. Technology mapping is also performed on the optimized logic design. Technology mapping includes determining how to implement logic gates and logic elements in the optimized logic representation with resources available on the target device. The resources available on the target device may be referred to as "cells" or "components" and may include logic-array blocks, registers, memories, digital signal processing blocks, input output elements, and other components. According to an embodiment of the present invention, an optimized technology-mapped netlist (cell netlist) is generated from the HDL.

According to an embodiment of the present invention, information regarding the DCS of a signal is used to make one or more optimization decisions for the system during synthesis. The DCS may be utilized for optimization during one or more stages of synthesis after HDL to RTL conversion. Furthermore, information regarding a signal's DCS, such as its realization set, may be propagated with the signal and be available for use for optimization after an initial optimization with the information has taken place.

At 103, the mapped logical system design is placed. Placement works on the optimized technology-mapped netlist to produce a placement for each of the functional blocks. According to an embodiment of the present invention, placement includes fitting the system on the target device by determining which resources available on the target device are to be used for specific function blocks in the optimized technology-mapped netlist. According to an embodiment of the present invention, placement may include clustering which involves grouping logic elements together to form the logic clusters present on the target device.

At 104, it is determined which routing resources should be used to connect the components in the target device implementing the functional blocks of the system. During routing, routing resources on the target device are allocated to provide interconnections between logic gates, logic elements, and other components on the target device. The routing procedure may be performed by a router in an EDA tool that utilizes routing algorithms.

At 105, an assembly procedure is performed. The assembly procedure involves creating a data file that includes some of the information determined by the procedure described by 101-104. The data file may be a bit stream that may be used to program the target device. According to an embodiment of the present invention, the procedures illustrated in FIG. 1 may be performed by an EDA tool executed on a first computer system. The data file generated may be transmitted to a second computer system to allow the design of the system to be further processed. Alternatively, the data file may be transmitted to a second computer system which may be used to program the target device according to the system design. It should be appreciated that the design of the system may also be output in other forms such as on a display device or other medium.

Figure 2:
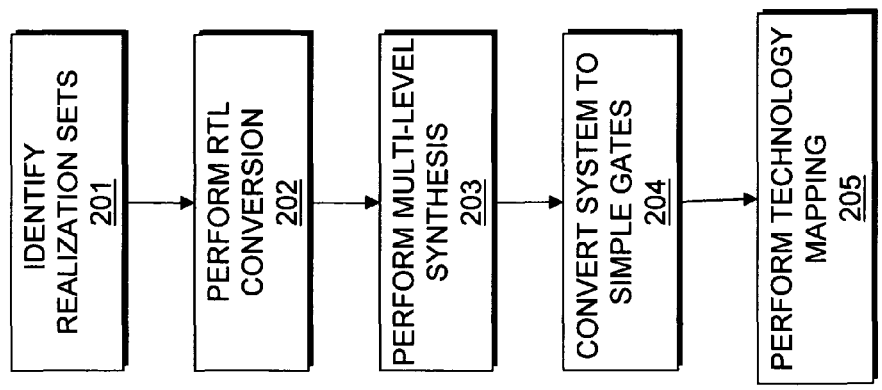
FIG. 2 is a flow chart illustrating a method for performing synthesis using DCSs according to an embodiment of the present invention.

FIG. 2 is a flow chart illustrating a method for performing synthesis using DCSs according to an embodiment of the present invention. The procedure illustrated in FIG. 2 may be implemented at the procedure 102 shown in FIG. 1. At 201, a realization set for each signal with a DCS is identified. According to an embodiment of the present invention, a realization set of a signal includes one or more representations of the signal's logic where at least one of the representation is influenced by a DCS and all representations are equivalent.

At 202, RTL conversion is performed where a system design in HDL is converted to building blocks in RTL. This may involve converting the system design to building blocks such as adders, registers, multipliers, and other components. According to an embodiment of the present invention, optimization of the RTL conversion may be performed by using the DCS information for signals in their realization sets.

At 203, multi-level synthesis (MLS) is performed where the system design is further described using gates having a plurality of inputs. MLS may include performing decomposition, factoring, division, sum of products representation, two-level minimization, and other optimization procedures on the system design. According to an embodiment of the present invention, MLS may be performed using the DCS information for signals in their realization sets.

At 204, the system design is simplified by representing its netlist with a basic network of gates. The basic network of gates may be, for example, simple 2-input gates. According to an embodiment of the present invention, the simplification may be performed using the DCS information for signals in their realization sets.

At 205, technology mapping is performed where the netlist is converted into technology specific resources on a target device. According to an embodiment of the present invention, technology mapping may be performed using the DCS information for signals in their realization sets.

In the past, DCS optimization was typically performed during conversion from HDL to RTL. After being used early in the flow, the information regarding DCS sets was discarded and the remaining procedures would proceed as normal. According to an embodiment of the present invention, the information regarding DCS sets is kept and used during subsequent synthesis procedures such as guiding MLS, conversion to simple gates, and technology mapping. At each stage, the DCS information is propagated forward.

FIG. 2 describes a procedure where a realization set for each signal is determined first and is utilized at one or more subsequent procedures during synthesis as represented at 202-205. It should be appreciated that the realization set may be utilized at some of the procedures shown at 202-205 and not utilized at other procedures shown at 202-205. It should further be appreciated that the procedure of identifying the realization set 201 need not be performed at the beginning of synthesis, but may be performed at later stages such as before, during or after one of the procedures 202-205.

Figure 3:
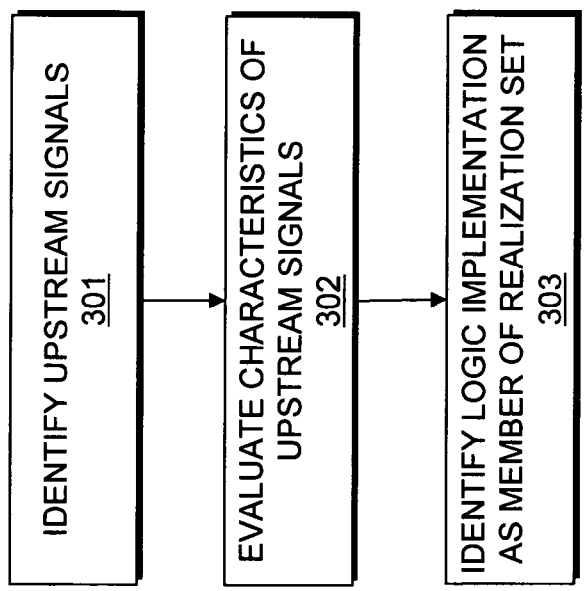
FIG. 3 is a flow chart illustrating a method for identifying a realization set for a signal according to an embodiment of the present invention.

FIG. 3 is a flow chart illustrating a method for identifying a realization set for a signal (output signal) according to an embodiment of the present invention. The procedure illustrated in FIG. 3 may be used to implement procedure 201 illustrated in FIG. 2. At 301, inputs for which the signal depends on are identified. These inputs may be signals that are upstream from the output signal.

At 302, the characteristics for each combination of identified inputs are evaluated. According to an embodiment of the present invention, a truth table is constructed for the output for each potential combination of inputs. The potential combinations include combinations of all functions in each input's realization set. For example, if the output signal has two inputs, each of which has two functions in their realization set, there would be four possible truth tables. According to an embodiment of the present invention, if the procedure is being performed early in the synthesis flow, instead of constructing a truth table a procedure for defining an output node for each of the different choices for the input node implementations may be performed.

For each truth table (or output node), applicable DCS for the inputs are applied to the truth table. According to an embodiment of the present invention, this may be achieved by iterating over the DCSs and checking if the truth table is a function of all members of a particular DCS. If it is, the DCS can be used to create don't care states in the truth table.

At 303, logic implementations for the signal are identified from the evaluated characteristics for the combination of identified inputs and are designated as members of the realization set. According to an embodiment of the present invention where truth tables are used, the logic implementations for the signals may be identified from the best possible coverings of the output signal. The best possible covering may be a covering that includes the largest area on the truth table. These coverings represent the realization set of the signal.

Figure 4A:
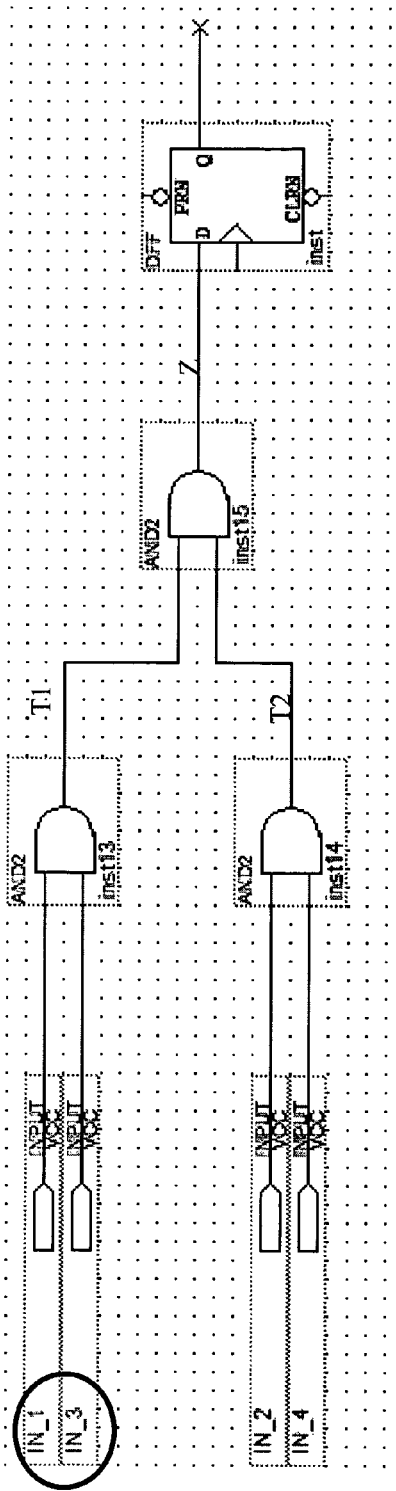
FIGS. 4a and 4b illustrate exemplary coverings derived for a circuit according to an embodiment of the present invention.
Figure 4B:
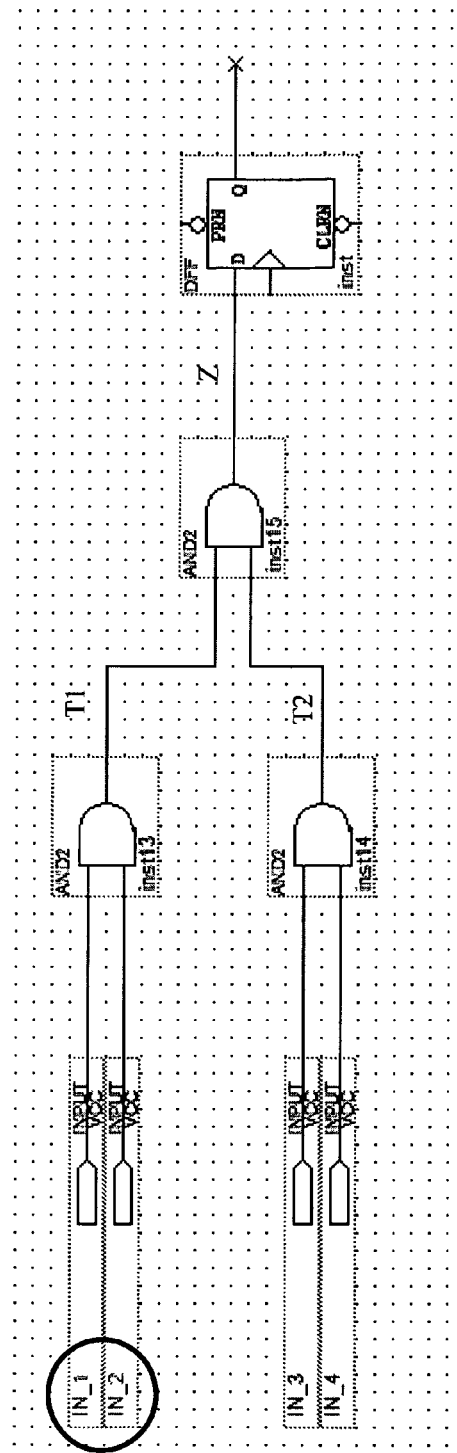

FIGS. 4a and 4b illustrate exemplary coverings derived for a circuit according to an embodiment of the present invention. In this example, the circuit includes two input signals, IN_1 and IN_2, that never assume the values {1,0}. According to an embodiment of the present invention, each stage of synthesis attempts to maximize the presence of DCSs in the netlist. The covering illustrated in FIG. 4b groups input signals IN_1 and IN_2 together allowing the effects of the DCS of the signals to manifest itself at T1. Having IN_1 and IN_2 feed the same AND gate allows for maximum flexibility and easier optimization of the system design. The covering illustrated in FIG. 4b allows T1 to be realized as either IN_1 or IN1 AND IN_2. If T1 feeds other logic, different potential implementations can be evaluated to see which is globally optimal.

In this example, there are two potential realizations of Z, IN_1*IN_2*IN_3*IN_4 or IN_1*IN_3*IN_4. Depending on to what logic Z fans out to, one realization may be more preferable to the other. Although it may seem that covering with fewer literals is preferred, there are cases where due to fanout re-convergence having the extra literal allows for an optimization that would not have been possible without the extra literal.

FIGS. 5a-c illustrate an example of how a realization set is computed for a signal T1 according to an embodiment of the present invention. From the covering illustrated in FIG. 4b, the DCS is represented by (IN_1 IN_2)→{10}. Referring back to FIG. 3, at 301, we identify the inputs which the output signal depends on. These are signals IN_1 and IN_2.

At 302, the characteristics for each combination of inputs are evaluated. This may be achieved by constructing a truth table. Since the inputs are realization sets of size 1, only one truth table is constructed, which is illustrated at FIG. 5a. There is a DCS where all signals are inputs to the truth table. Thus, we add the Don't Care states to the system to get the truth table illustrated in FIG. 5b.

Referring back to FIG. 3, at 303, logic implementations are identified as members of the realization set. FIG. 5c illustrates that there are two potentially optimal coverings for the table. Thus, the realization set of T1 is {IN_1, IN_2 IN_1} as these are both valid coverings of the function.

This procedure may be repeated for output signal T2. Since there are no applicable DCSs, T2's realization set is determined to be a single function, {IN_3 IN_4}. Once we arrive at T3, we can repeat the process but this time we generate two truth tables (since T1 has two members in its realization set). We eventually find that neither truth table has an applicable DCS and we find that T3's realization set is {IN_1 IN_3 IN_4, IN_1 IN_2 IN_3 IN_4}, one function for each value of the input T1.

Figures 6A, 6B:
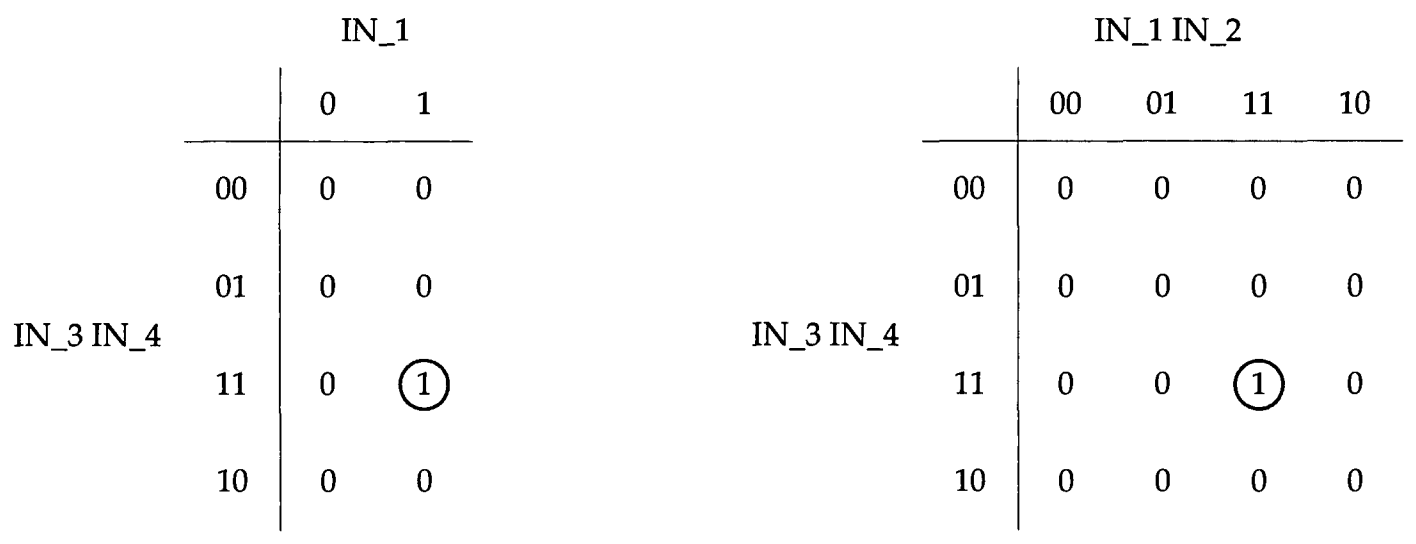

FIGS. 6a-b illustrate an example of how a realization set is computed for a signal T3 according to an embodiment of the present invention. FIGS. 6a and 6b represent the two possible truth tables for T3. FIG. 6a illustrates a truth table using realization sets IN_1, IN_3, and IN_4. FIG. 6b illustrates a truth table using realization sets IN_1, IN_2, IN_3, and IN_4.

Figure 7:
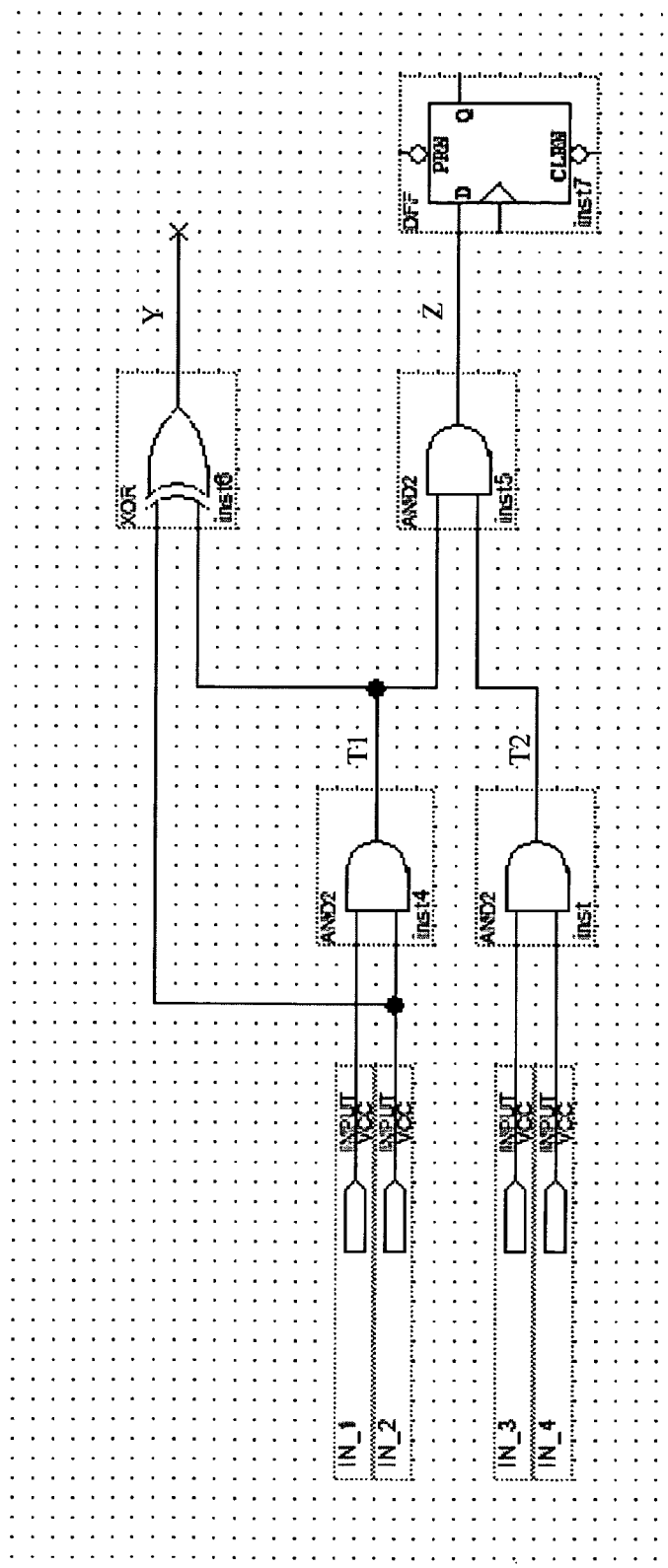
FIG. 7 illustrates an example of how a realization set is computed for a signal T1 according to an embodiment of the present invention.

FIG. 7 illustrates an example of how a realization set is computed for a signal Y according to an embodiment of the present invention. FIG. 7 illustrates an example where, due to fanout reconvergence, having an extra literal allows an optimization that would not have been possible without its presence. Since most synthesis algorithms attempt to re-use existing signals to reduce area, creating signals that include DCSs promotes the propagation of these DCSs to other parts of the circuit. For example, in FIG. 7, the signal T1 can be re-used to realize a new function Y, which can leverage the multiple realizations to reduce Y.

In this example, Y has the following relationship.

$$Y = IN\_2 XOR \{IN\_1, IN\_1 * IN\_2\}$$

Although selection of the realization IN_1 was optimal for Z, selecting IN_1*IN_2 is optimal for Y, and the function can reduce to the following relationship.

$$Y = IN\_2 XOR IN\_1 * IN\_2$$

$$Y = IN\_2 * (NOT IN\_1)$$

This is likely less complex than IN_1 XOR IN_2, which is what results from selecting T1=IN_1. Without grouping the two inputs IN_1 and IN_2 together using the first covering, Z can still be realized as IN_1*IN_2*IN_3*IN_4. It may later be observed that the members of the DCS are all present in Z's inputs and can be reduced accordingly. However, this would result in having other fanouts of T1, such as Y, not benefit from the DCS. This may generate a sub-optimal solution.

This procedure can grow exponentially in scope as the realization sets propagate through the system. To help avoid potential performance and memory problems associated with this the sets can be pruned at certain points and the overall size of a set can be limited at any given point. One potential way to prune the space at a given point would be to reconstruct the truth table of a signal, including all 'Don't Care' states and then apply existing algorithms to determine an optimal covering of that table. To reconstruct the table a base function can be defined to be the logical conjunction of all members of the realization set. Next, the truth table may be drawn for the base function. Iteration can be made through all members of the realization set, and all 1's in the truth table of a member that don't exist in the base function can be treated as 'Don't Care' states. After this procedure is completed, a single truth table is left that includes a number of 'Don't Care' states which can be covered as desired to produce a single function that will serve as the realization set for a node. This means that the realization set has effectively been collapsed and its size has been reset back to 1 by choosing an implementation.

Note that the DCS is not a constraint, so it does not have to be used by the synthesis tool and should only lead to new optimal solutions, it should not lead the tool away from existing optimal solutions.

As illustrated, DCS information, of a signal, such as a realization set, may be propagated through a system. This information may be utilized to perform a plurality of separate optimizations on the logic of system. After an initial optimization is made to a group of logic, the information may be further used to perform additional optimizations on additional logic at a different location and/or at a during a different procedure in synthesis. The optimizations may be performed during multi-level synthesis, conversion of the system to 2-input gates, during technology mapping, or during other procedures after RTL conversion.

The propagation of DCS information forward from early stages in synthesis allow for additional applications of DCS in the design flow. For example, DCSs may be used to improve design verification. If there are states in the system that cannot be reached, there is no need to provide test coverage for such states. This information can be used to test vector generation algorithms and help them avoid testing these cases. It may also be used to prune a given set of test vectors. For example, if two vectors differ in coverage only in cases that involve DCSs, one of the cases can be marked as redundant.

DCSs may also be used to improve vectorless power estimation. When power estimation is run without vectors, toggle rates are typically derived through statistical methods. Since little is known about the inputs or potential relations between nodes in the design, the tool is limited with how it models internal states. However, if the DCS information is passed into a power estimation engine, certain states will have zero probability of being reached. This information can be propagated to provide more accurate modeling of nodes elsewhere in the design.

DCSs may also be used to infer assertions. Assertion logic may be inserted for user-specified DCSs or to automatically generate a Don't Care Network based on a user's specified don't care state. These assertions or network can be used to verify whether DCS assumptions are true. In the case of assertions, any condition that is triggered during simulation in software would imply a DCS violation has occurred. If the assertion logic is synthesized into hardware, assertion failures in a system may be checked at the speed of the system. If a network is specified, the test vectors for the network can be the DCS of the system and any input vector that does not result in the output being true shows a violation of the DCS in the system.

Figure 8:
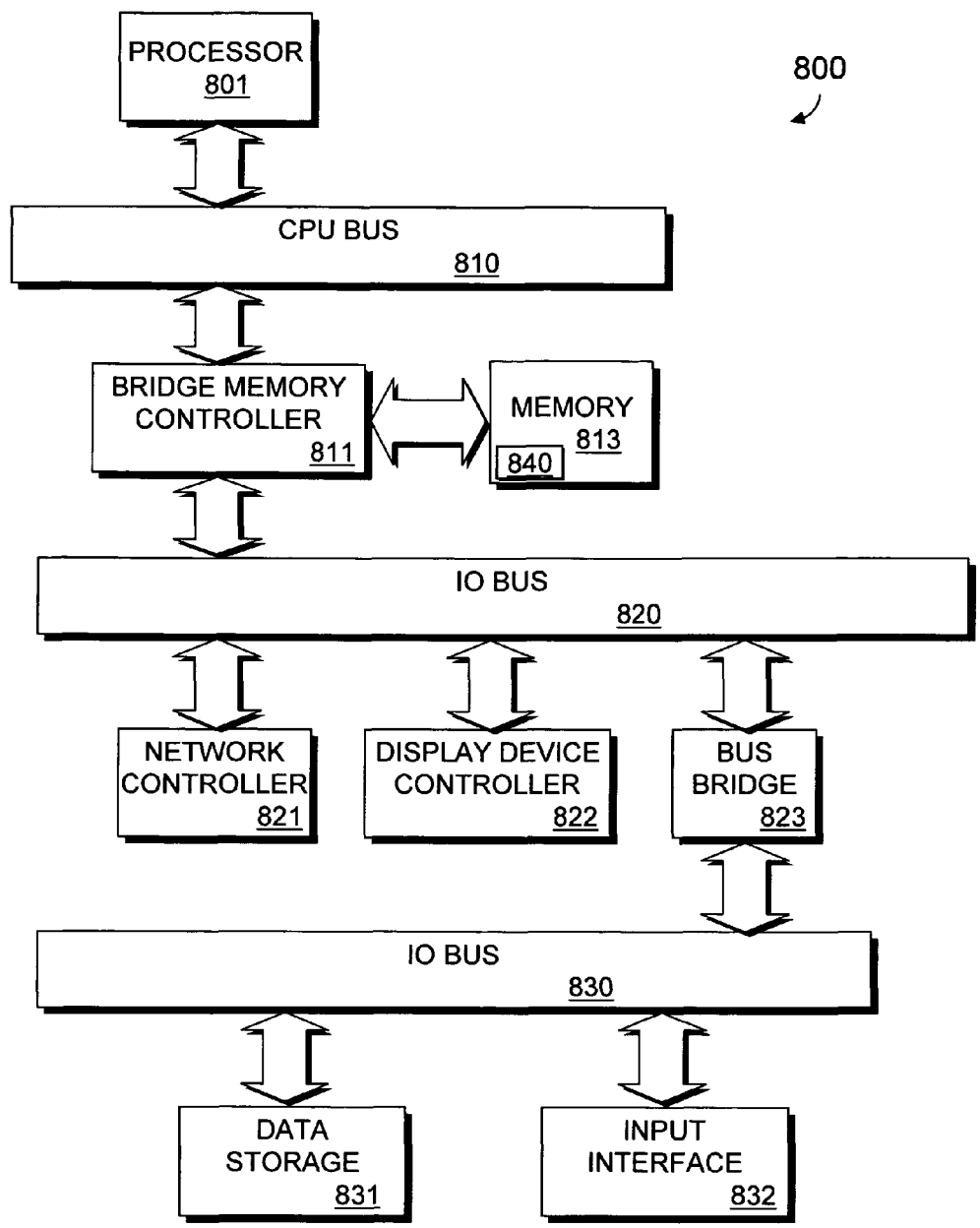
FIG. 8 is a block diagram of a computer system implementing a system designer according to an embodiment of the present invention.

FIG. 8 is a block diagram of an exemplary computer system 800 in which an example embodiment of the present invention resides. The computer system 800 includes a processor 801 that processes data signals. The processors 801 is coupled to a CPU bus 810 that transmits data signals between processor 801 and other components in the computer system 800.

The computer system 800 includes a memory 813. The memory 813 may store instructions and code represented by data signals that may be executed by the processor 801. A bridge memory controller 811 is coupled to the CPU bus 810 and the memory 813. The bridge memory controller 811 directs data signals between the processor 801, the memory 813, and other components in the computer system 800 and bridges the data signals between the CPU bus 810, the memory 813, and a first IO bus 820.

The first IO bus 820 may be a single bus or a combination of multiple buses. The first IO bus 820 provides communication links between components in the computer system 800. A network controller 821 is coupled to the first IO bus 820. The network controller 821 may link the computer system 800 to a network of computers (not shown) and supports communication among the machines. A display device controller 822 is coupled to the first IO bus 820. The display device controller 822 allows coupling of a display device (not shown) to the computer system 800 and acts as an interface between the display device and the computer system 800.

A second IO bus 830 may be a single bus or a combination of multiple buses. The second IO bus 830 provides communication links between components in the computer system 800. A data storage device 831 is coupled to the second IO bus 830. An input interface 832 is coupled to the second IO bus 830. The input interface 832 allows coupling of an input device to the computer system 800 and transmits data signals from an input device to the computer system 800. A bus bridge 823 couples the first IO bus 820 to the second IO bus 830. The bus bridge 823 operates to buffer and bridge data signals between the first IO bus 820 and the second IO bus 830. It should be appreciated that computer systems having a different architecture may also be used to implement the computer system 800.

A system designer 840 may reside in memory 813 and be executed by the processor 801. The system designer 840 may operate to identify DCSs, synthesize a system, place the system on a target device, route and assemble the system. According to an embodiment of the present invention, the system designer 840 utilizes the DCSs for optimizing a system design during synthesis. The DCSs may be utilized for optimization during one or more stages of synthesis after RTL conversion.

Furthermore, information regarding a signal's DCS, such as its realization set, may be propagated with the signal and be available for use for optimization at additional locations on the system or at additional instances after an initial optimization with the information has taken place.

Figure 9:
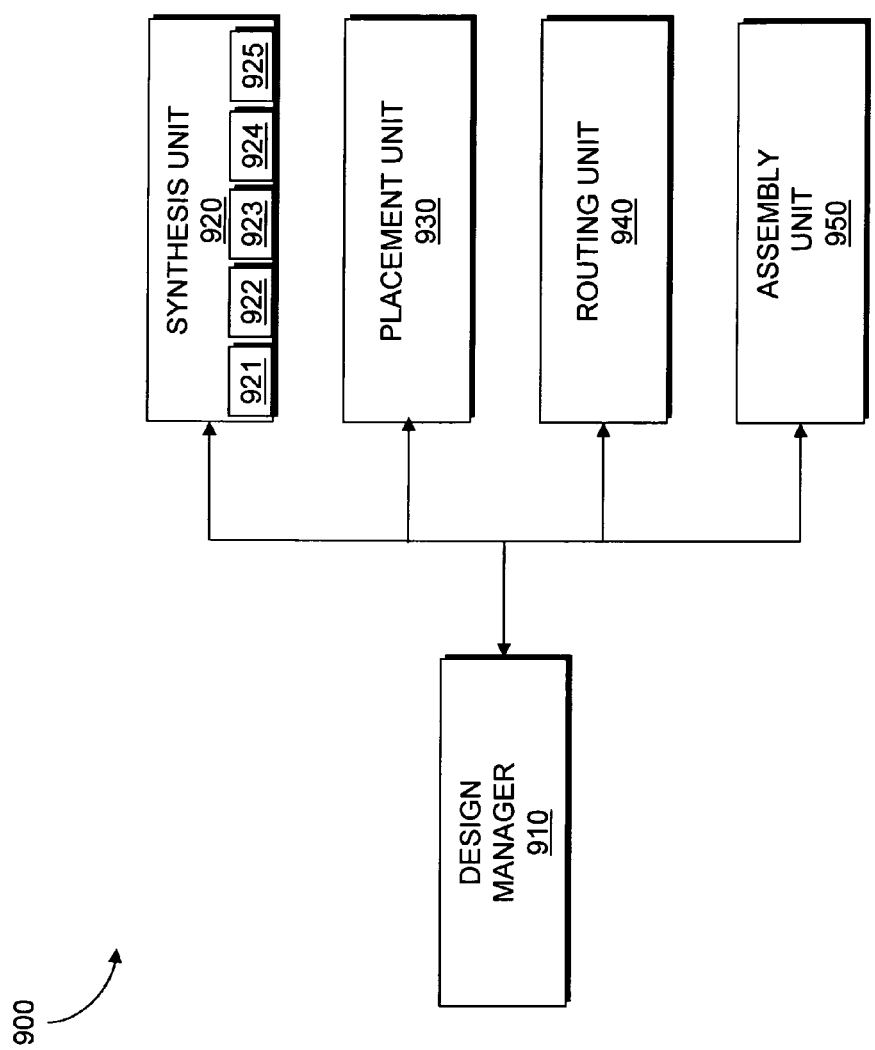
FIG. 9 is a block diagram of a system designer unit according to an embodiment of the present invention.

FIG. 9 illustrates a system designer 900 according to an embodiment of the present invention. The system designer 900 may be an EDA tool for designing a system on a target device such as an FPGA or other circuitry. FIG. 9 illustrates modules implementing an embodiment of the system designer 900. According to one embodiment, the modules represent software modules and system design may be performed by a computer system such as the one illustrated in FIG. 8 executing sequences of instructions represented by the modules shown in FIG. 9. Execution of the sequences of instructions causes the computer system to support system design as will be described hereafter. In an alternate embodiment, the modules represent hardware modules that may be implemented using hardware. It should be appreciated that in other embodiments, hard-wire circuitry may be used in place of or in combination with software instructions to implement embodiments of present invention. Thus, embodiments of present invention are not limited to any specific combination of hardware circuitry and software.

The system designer 900 includes a designer manager 910. The designer manager 910 is connected to and transmits data between the components of the system designer 900. According to an embodiment of the present invention, the designer manager 910 may include a user interface to allow a user to input signal list specifications, network specifications, HDL assertion statements, simulation results, and/or other information to allow the system designer 900 to identify DCSs. The user interface may also provide suggested DCSs to the user and allow the user to indicate which DCSs to accept and to reject.

The system designer 900 includes a synthesis unit 920. The synthesis unit 920 generates a cell netlist from a design of a system to be implemented on the target device. According to an embodiment of the system designer 900, the synthesis unit 920 takes a conceptual HDL design definition and generates an optimized logical representation of the system. The optimized logical representation of the system generated by the synthesis unit 920 may include a representation that has a minimized number of functional blocks and registers, such as logic gates and logic elements, required for the system. Alternatively, the optimized logical representation of the system generated by the synthesis unit 920 may include a representation that has a reduced depth of logic and that generates a lower signal propagation delay. The synthesis unit 920 also determines how to implement the functional blocks and registers in the optimized logic representation utilizing resources such as cells on a target. The technology-mapped netlist illustrates how the resources (cells) on the target device are utilized to implement the system. In an embodiment where the target device is an FPGA or PLD, the technology-mapped netlist may include cells such as LABs, registers, memory blocks, DSP blocks, IO elements or other components.

The synthesis unit 920 includes a realization set unit 921 that identifies a realization set for each signal with a DCS. According to an embodiment of the present invention, a realization set of a signal includes one or more representations of the signal's logic where at least one of the representations is influenced by a DCS and all representations are equivalent.

The synthesis unit 920 includes a RTL conversion unit 922 that converts a system design in HDL to building blocks in RTL. This RTL conversion unit 922 may convert the system design to building blocks such as adders, registers, multipliers, and other components. According to an embodiment of the present invention, optimization of the RTL conversion may be performed by using DCS information for signals in their realization sets.

The synthesis unit 920 includes a multi-level synthesis (MLS) unit 923 that further describes the system design using gates having a plurality of inputs. The MLS unit 923 may perform decomposition, factoring, division, sum of products representation, two-level minimization, and other optimization procedures on the system design. According to an embodiment of the present invention, the MLS unit 923 may utilize the DCS information for signals in their realization sets to optimize the description of the system design.

The synthesis unit 920 includes a simplification unit 924 that simplifies the system design described by the MLS unit 923 with a basic network of gates. The basic network of gates may be, for example, simple 2-input gates. According to an embodiment of the present invention, the simplification unit 924 may utilize the DCS information for signals in their realization sets to optimize the description of the system design.

The synthesis unit 920 includes a technology mapping unit 925 that performs technology mapping where the netlist is converted into technology specific resources on a target device. According to an embodiment of the present invention, technology mapping may be performed using the DCS information for signals in their realization sets.

The system designer 900 includes a placement unit 930 that performs placement. The placement unit 260 processes the merged cell netlist to produce a placement for each of the cells in the merged cell netlist.

The system designer 900 includes a routing unit 940 that performs routing. The routing unit 940 determines the routing resources on the target device to use to provide interconnection between the components implementing functional blocks and registers of the logic design.

The system designer 900 includes an assembly unit 950 that performs an assembly procedure that creates a data file that includes the design of the system generated by the system designer 900. The data file may be a bit stream that may be used to program the target device. The assembly unit 950 may output the data file so that the data file may be stored or alternatively transmitted to a separate machine used to program the target device. It should be appreciated that the assembly unit 950 may also output the design of the system in other forms such as on a display device or other medium.

FIG. 9 illustrates an exemplary block diagram of a system designer 900. It should be appreciated that addition components may be implemented on the system designer 900, that not all of the components illustrated are necessary to implement the system designer 900, and that the illustrated components may be substituted with other components.

Figure 10:
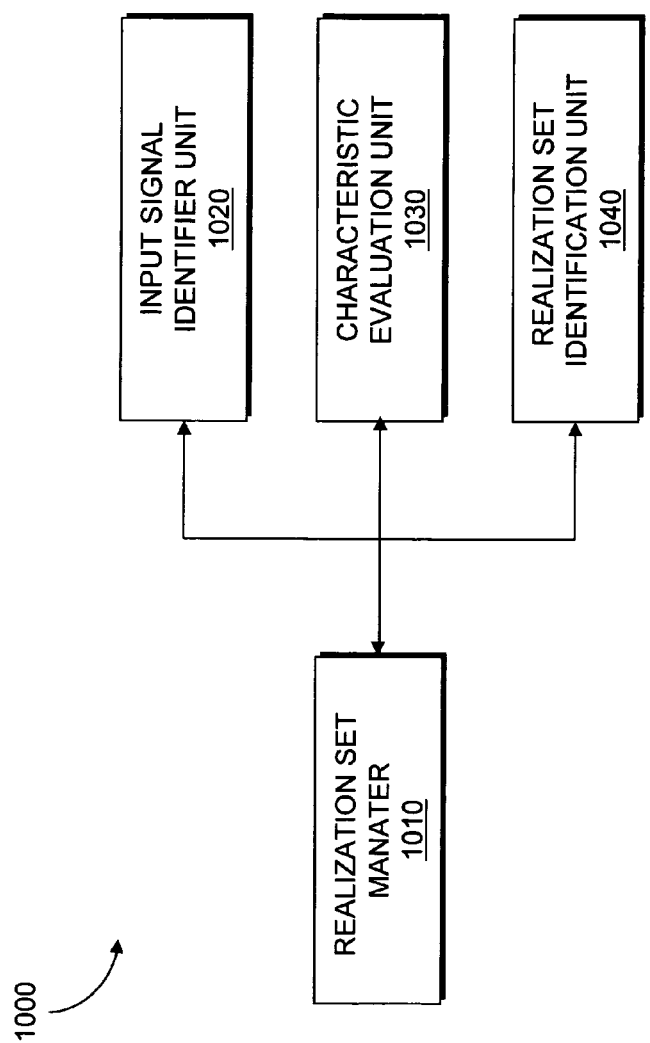
FIG. 10 is a block diagram of a realization set unit according to an embodiment of the present invention.

FIG. 10 is a block diagram of a realization set unit 1000 according to an embodiment of the present invention. The realization set unit 1000 may be used to implement the realization set unit 921 illustrated in FIG. 9. The realization set unit 1000 includes a realization set manager 1010. The realization set manager 1010 is connected to and transmits data between the components of the realization set unit 1000.

The realization set unit 1000 includes an input signal identifier unit 1020. The input signal identifier unit 1020 identifies inputs for which an output signal depends on. According to an embodiment of the realization set unit 1000, the input signal identifier unit 1020 identifies signals that are upstream from the output signal.

The realization set unit 1000 includes characteristic evaluation unit 1030. The characteristic evaluation unit 1030 evaluates the characteristics for each combination of identified input signals. According to one embodiment, a truth table is constructed for the output for each potential combination of inputs. The potential combinations include combinations of all functions in each input's realization set. For each truth table, applicable DCS for the inputs are applied to the truth table. According to an embodiment of the present invention, this may be achieved by iterating over the DCSs and checking if the truth table is a function of all members of a particular DCS. If it is, the DCS can be used to create don't care states in the truth table.

The realization set unit 1000 includes a realization set identifier unit 1040. The realization set identifier unit identifies possible logic implementations for the output signal from the evaluated characteristics for the combination of identified inputs. These possible logic implementations are designated as members of the realization set. According to an embodiment of the present invention where truth tables are used, the logic implementations for the signals may be identified from the best possible coverings of the output signal. The best possible covering may be a covering that includes the largest area on the truth table. These coverings represent the realization set of the signal.

Figure 11:
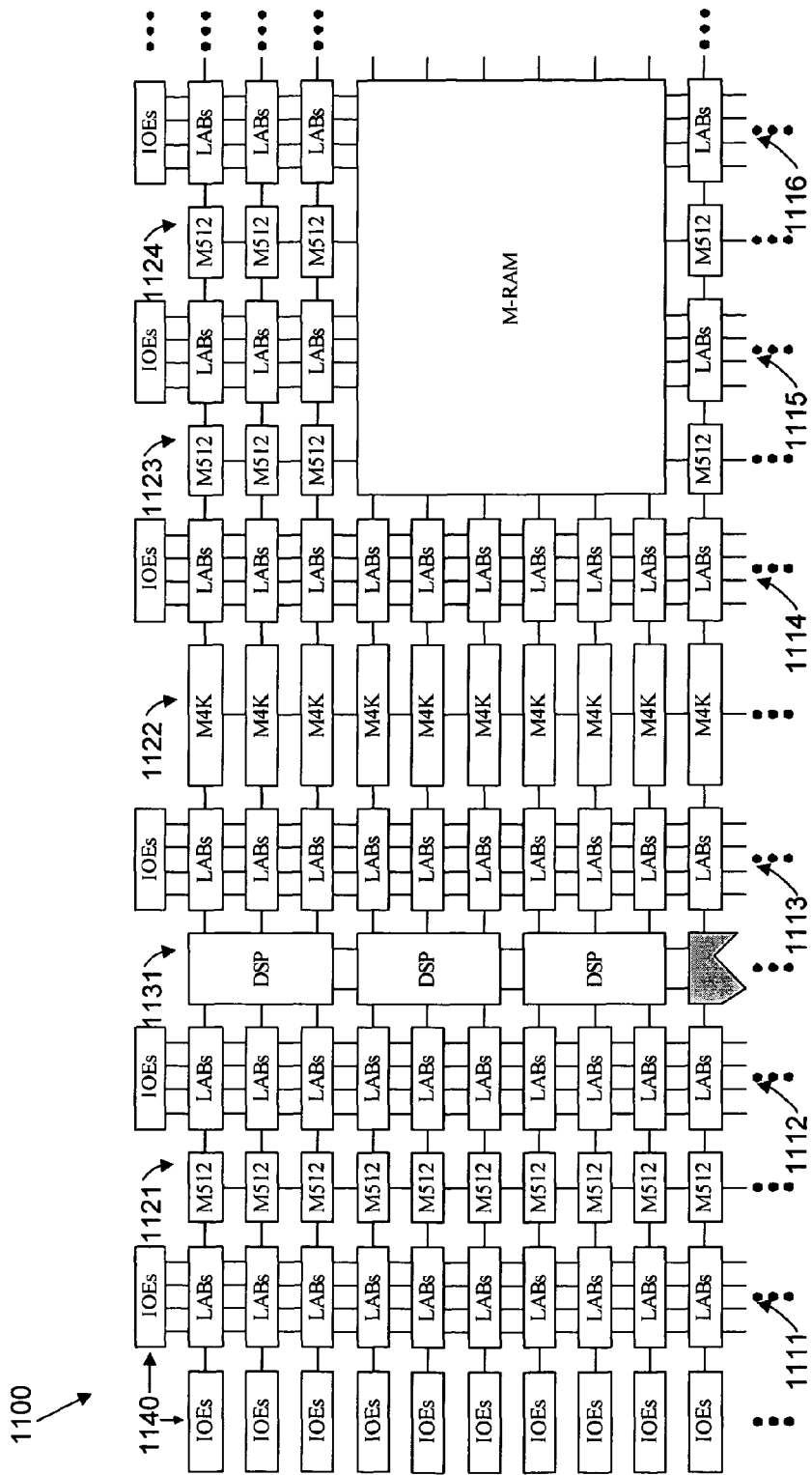
FIG. 11 illustrates an exemplary target device according to an embodiment of the present invention.

FIG. 11 illustrates an exemplary target device 1100 in which a system may be implemented on 1100 utilizing an FPGA according to an embodiment of the present invention. According to one embodiment, the target device 1100 is a chip having a hierarchical structure that may take advantage of wiring locality properties of circuits formed therein.

The target device 1100 includes a plurality of logic-array blocks (LABs). Each LAB may be formed from a plurality of logic blocks, carry chains, LAB control signals, look up table (LUT) chain, and register chain connection lines. A logic block is a small unit of logic providing efficient implementation of user logic functions. A logic block includes one or more combinational cells, where each combinational cell has a single output, and registers. According to one embodiment of the present invention, the logic block may operate similarly to a logic element (LE), such as those found in Stratix™ manufactured by Altera® Corporation, or a combinational logic block (CLB) such as those found in Virtex™ manufactured by Xilinx® Inc. In this embodiment, the logic block may include a four input lookup table (LUT) with a configurable register. According to an alternate embodiment of the present invention, the logic block may operate similarly to an adaptive logic module (ALM), such as those found in Stratix™ II manufactured by Altera® Corporation. LABs are grouped into rows and columns across the target device 1100. Columns of LABs are shown as 1111-1116. It should be appreciated that the logic block may include additional or alternate components.

The target device 1100 includes memory blocks. The memory blocks may be, for example, dual port random access memory (RAM) blocks that provide dedicated true dual-port, simple dual-port, or single port memory up to various bits wide at up to various frequencies. The memory blocks may be grouped into columns across the target device in between selected LABs or located individually or in pairs within the target device 1100. Columns of memory blocks are shown as 1121-1124.

The target device 1100 includes digital signal processing (DSP) blocks. The DSP blocks may be used to implement multipliers of various configurations with add or subtract features. The DSP blocks include shift registers, multipliers, adders, and accumulators. The DSP blocks may be grouped into columns across the target device 1100 and are shown as 1131.

The target device 1100 includes a plurality of input/output elements (IOEs) 1140. Each IOE feeds an I/O pin (not shown) on the target device 1100. The IOEs are located at the end of LAB rows and columns around the periphery of the target device 1100. Each IOE includes a bidirectional I/O buffer and a plurality of registers for registering input, output, and output-enable signals. When used with dedicated clocks, the registers provide performance and interface support with external memory devices.

The target device 1100 may include routing resources such as LAB local interconnect lines, row interconnect lines ("H-type wires"), and column interconnect lines ("V-type wires") (not shown) to route signals between components on the target device.

FIG. 11 illustrates an exemplary embodiment of a target device. It should be appreciated that a system may include a plurality of target devices, such as that illustrated in FIG. 11, cascaded together. It should also be appreciated that the target device may include programmable logic devices arranged in a manner different than that on the target device 1100. A target device may also include FPGA resources other than those described in reference to the target device 1100.

FIGS. 1 through 3 are flow charts illustrating methods according to embodiments of the present invention. The techniques illustrated in these figures may be performed sequentially, in parallel or in an order other than that which is described. The techniques may be also be performed one or more times. It should be appreciated that not all of the techniques described are required to be performed, that additional techniques may be added, and that some of the illustrated techniques may be substituted with other techniques.

Embodiments of the present invention may be provided as a computer program product, or software, that may include an article of manufacture on a machine accessible or machine readable medium having instructions. The instructions on the machine accessible or machine readable medium may be used to program a computer system or other electronic device. The machine-readable medium may include, but is not limited to, floppy diskettes, optical disks, CD-ROMs, and magneto-optical disks or other type of media/machine-readable medium suitable for storing electronic instructions. The techniques described herein are not limited to any particular software configuration. They may find applicability in any computing or processing environment. The terms "computer-readable medium", "machine accessible medium" or "machine readable medium" used herein shall include any medium that is capable of storing, or encoding a sequence of instructions for execution by the machine and that cause the machine to perform any one of the methods described herein. Furthermore, it is common in the art to speak of software, in one form or another (e.g., program, procedure, process, application, module, unit, logic, and so on) as taking an action or causing a result. Such expressions are merely a shorthand way of stating that the execution of the software by a processing system causes the processor to perform an action to produce a result.

In the foregoing specification embodiments of the invention has been described with reference to specific exemplary embodiments thereof. It will, however, be evident that various modifications and changes may be made thereto without departing from the broader spirit and scope of the embodiments of the invention. The specification and drawings are, accordingly, to be regarded in an illustrative rather than restrictive sense.

What is claimed is:

1. A method for designing a system on a target device, the method comprising:
    determining a realization set of a signal that includes one or more representations of the signal by identifying upstream signals which the signal depends on, constructing a truth table for each combination of the upstream signals where the combination accounts for all members of a realization set of an upstream signal, applying available DCSs to each truth table, identifying coverings for each truth table, and designating each covering as an entry in the realization set, wherein at least one representation of the one or more representations of the signal is influenced by a Don't Care Set (DCS);
    propagating the realization set through the system with the signal; and
    performing a plurality of optimizations on the system at different stages of synthesis by using the DCS, wherein the plurality of optimizations is performed during technology mapping, and wherein at least one of the determining, propagating, and performing is conducted with a processor.

2. The method of claim 1, further comprising identifying an upstream signal with a DCS.

3. The method of claim 2, wherein identifying the upstream signal with DCS comprises reading a signal list specification input by a designer.

4. The method of claim 2, wherein identifying the upstream signal with DCS comprises testing an input on a network specification.

5. The method of claim 2, wherein identifying the upstream signal with DCS comprises analyzing simulation results.

6. The method of claim 1, wherein the plurality of optimizations is performed during conversion of the system to 2-input gates.

7. The method of claim 1, wherein the plurality of optimizations are performed at more than one stage of synthesis that include register transfer level (RTL) conversion, multi-level synthesis (MLS), conversion to 2-input gates, and technology mapping.

8. The method of claim 1, wherein one of the plurality of optimizations comprises performing multi-level synthesis using the realization set that includes the representation of the signal influenced by the DCS, wherein a system design is described by gates having a plurality of inputs.

9. The method of claim 8, wherein performing multi-level synthesis comprises performing decomposition using the realization set that includes the representation of the signal influenced by the DCS.

10. The method of claim 8, wherein performing multi-level synthesis comprises performing factoring using the realization set that includes the representation of the signal influenced by the DCS.

11. The method of claim 8, further comprising using the realization set that includes the representation of the signal influenced by the DCS to convert a system design from hardware description language (HDL) to building blocks in RTL.

12. The method of claim 8, wherein converting the system design to building blocks in RTL comprises using the realization set that includes the representation of the signal influenced by the DCS to convert a system design from HDL to adders, registers, and multipliers.

13. The method of claim 8, further comprising using the realization set that includes the representation of the signal influenced by the DCS to convert a system design to 2-input gates.

14. The method of claim 8, further comprising using the realization set that includes the representation of the signal influenced by the DCS to perform technology mapping.

15. A non-transitory computer-readable medium including sequences of instructions stored thereon for causing a computer to execute a method comprising:
    determining a realization set of a signal that includes one or more representations of the signal by identifying upstream signals which the signal depends on, constructing a truth table for each combination of the upstream signals where the combination accounts for all members of a realization set of an upstream signal, applying available DCSs to each truth table, identifying coverings for each truth table, and designating each covering as an entry in the realization set, wherein at least one representation of the one or more representations is influenced by a Don't Care Set (DCS); and
    optimizing logic on a system design during a plurality of different stages of synthesis by using the realization set and by taking the DCS into consideration, wherein optimizing the logic is performed during technology mapping.

16. The non-transitory computer-readable medium of claim 15, wherein using the realization set to optimize the logic is performed during multi-level synthesis.

17. The non-transitory computer-readable medium of claim 15, wherein optimizing the logic is performed during conversion of the system to 2-input gates.

18. The non-transitory computer-readable medium of claim 15, wherein the DCS represents a set of one or more values that are not taken for the signal in response to one or more conditions.

19. The non-transitory computer-readable medium of claim 18, wherein the one or more condition comprises a value at an input.

20. The non-transitory computer-readable medium of claim 15 further comprising identifying an upstream signal with a DCS.

21. A method for designing a system on a target device, the method comprising:
   identifying upstream signals which a signal depends on;
   constructing a truth table for each combination of the upstream signals, wherein the combination accounts for all members of a realization set of an upstream signal;
   applying available Don't Care Sets (DCS) to each truth table;
   identifying coverings for each truth table;
   designating each covering as an entry in the realization set; and
   optimizing the system using the realization set, wherein at least one of the identifyings, constructing, applying, identifying, and optimizing is performed by a processor.

22. The method of claim 21, wherein the DCS represents a set of one or more values that are not taken for the signal in response to one or more conditions.

23. The method of claim 22, wherein the one or more condition comprises a value at an input.

24. The method of claim 21, further comprising identifying an upstream signal with a DCS.

25. The method of claim 24, wherein identifying the upstream signal with the DCS comprises reading a signal list specification input by a designer.

26. The method of claim 24, wherein identifying the upstream signal with the DCS comprises testing an input on a network specification.

27. The method of claim 24, wherein identifying the upstream signal with DCS comprises analyzing simulation results.

28. The method of claim 21, wherein the realization set is used in more than one instance for optimizing logic.

29. The method of claim 21, wherein the plurality of optimizations is performed during multi-level synthesis.

30. A synthesis unit, comprising:
   a characteristic evaluation unit operable to construct a truth table for each combination of upstream signals where the combination accounts for all members of a realization set of an upstream signal, and to apply available Don't Care Sets (DCSs) to each truth table; and
   a realization set identifier unit operable to identify coverings for each truth table and to designate each covering as an entry in a realization set, wherein the synthesis unit is operable to utilize the realization set to perform a plurality of optimizations on a system, and wherein at least one of the characteristic evaluation unit and realization set identifier unit is implemented by a processor.

31. The synthesis unit of claim 30, wherein the DCS represents a set of one or more values that are not taken for the signal in response to one or more conditions.

32. The synthesis unit of claim 31, wherein the one or more condition comprises a value at an input.

33. The synthesis unit of claim 30, wherein the plurality of optimizations is performed during multi-level synthesis.

34. The synthesis unit of claim 30, wherein the plurality of optimizations is performed during conversion of the system to 2-input gates.

35. The synthesis unit of claim 30, wherein the plurality of optimizations is performed during technology mapping.

36. The synthesis unit of claim 30, wherein the synthesis unit comprises an input signal identifier unit to identify upstream signals which the signal depends on.

* * * * *